United States Patent
Tomioka et al.

(10) Patent No.: US 8,956,882 B1
(45) Date of Patent: Feb. 17, 2015

(54) METHOD OF MANUFACTURING MAGNETORESISTIVE ELEMENT

(71) Applicants: Kazuhiro Tomioka, Seoul (KR); Satoshi Seto, Seoul (KR); Masatoshi Yoshikawa, Seoul (KR); Satoshi Inada, Yokohama (JP)

(72) Inventors: Kazuhiro Tomioka, Seoul (KR); Satoshi Seto, Seoul (KR); Masatoshi Yoshikawa, Seoul (KR); Satoshi Inada, Yokohama (JP)

( * ) Notice: Subject to any disclaimer, the term of this patent is extended or adjusted under 35 U.S.C. 154(b) by 0 days.

(21) Appl. No.: 14/200,510

(22) Filed: Mar. 7, 2014

Related U.S. Application Data

(60) Provisional application No. 61/877,246, filed on Sep. 12, 2013.

(51) Int. Cl.
  *H01L 21/00* (2006.01)
  *H01L 43/12* (2006.01)

(52) U.S. Cl.
  CPC ..................... *H01L 43/12* (2013.01)
  USPC ............... 438/3; 438/694; 438/695; 438/706; 438/734

(58) Field of Classification Search
  None
  See application file for complete search history.

(56) References Cited

U.S. PATENT DOCUMENTS

| | | |
|---|---|---|
| 7,015,524 B2 | 3/2006 | Ikeda |
| 2004/0222185 A1 | 11/2004 | Kawai |
| 2006/0056115 A1 | 3/2006 | Djayaprawira et al. |
| 2007/0195592 A1 | 8/2007 | Yuasa |
| 2008/0055793 A1 | 3/2008 | Djayaprawira et al. |
| 2008/0124454 A1 | 5/2008 | Djayaprawira et al. |
| 2008/0180862 A1 | 7/2008 | Djayaprawira et al. |
| 2010/0097846 A1 | 4/2010 | Sugiura et al. |
| 2010/0181632 A1 | 7/2010 | Yuasa |
| 2011/0031570 A1 | 2/2011 | Yuasa |
| 2011/0094875 A1 | 4/2011 | Djayaprawira et al. |
| 2012/0161262 A1 | 6/2012 | Yuasa |
| 2012/0244641 A1 | 9/2012 | Tomioka |
| 2013/0017626 A1 | 1/2013 | Tomioka |
| 2013/0098868 A1 | 4/2013 | Nishimura et al. |
| 2013/0228883 A1 | 9/2013 | Yuasa |
| 2014/0087485 A1* | 3/2014 | Tomioka .......................... 438/3 |

FOREIGN PATENT DOCUMENTS

| | | |
|---|---|---|
| JP | 10-041308 A | 2/1998 |
| JP | 2005-314791 A | 11/2005 |
| JP | 2005-340260 A | 12/2005 |
| JP | 2006-278457 A | 10/2006 |
| WO | WO 2011/030529 A1 | 3/2011 |

OTHER PUBLICATIONS

U.S. Appl. No. 14/201,108; First Named Inventor: Satoshi Inada; Title: "Method of Manufacturing Magnetoresistive Element", filed Mar. 7, 2014.

(Continued)

*Primary Examiner* — Jack Chen
(74) *Attorney, Agent, or Firm* — Holtz, Holtz, Goodman & Chick PC

(57) ABSTRACT

According to one embodiment, a method of manufacturing a magnetoresistive element, the method includes forming a first non-magnetic layer on a first magnetic layer, forming a second magnetic layer on the first non-magnetic layer, forming a second non-magnetic layer on the second magnetic layer, forming a third magnetic layer on the second non-magnetic layer, patterning the third magnetic layer by a RIE using an etching gas including a noble gas and a nitrogen gas until a surface of the second non-magnetic layer is exposed, and patterning the second non-magnetic layer and the second magnetic layer after patterning of the third magnetic layer.

20 Claims, 17 Drawing Sheets

(56) References Cited

OTHER PUBLICATIONS

U.S. Appl. No. 14/200,429; First Named Inventor: Kazuhiro Tomioka; Title: "Magnetic Element and Method of Manufacturing the Same", filed Mar. 7, 2014.

Jun Hayakawa, et al.: "Dependence of Giant Tunnel Magnetoresistance of Sputtered CoFeB/MgO/CoFeB Magnetic Tunnel Junctions on MgO Barrier Thickness and Annealing Temperature", Japanese Journal of Applied Physics, vol. 44, No. 19, Apr. 22, 2005, pp. L587 to L589 (in English).

U.S. Appl. No. 14/026,397, filed Sep. 13, 2013.

* cited by examiner

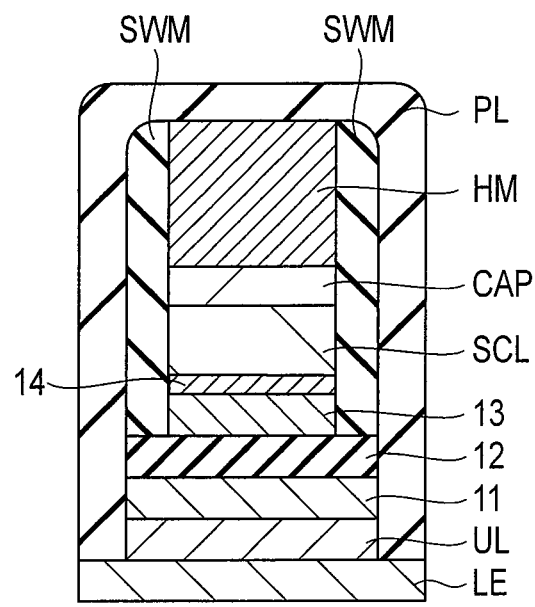
F I G. 1
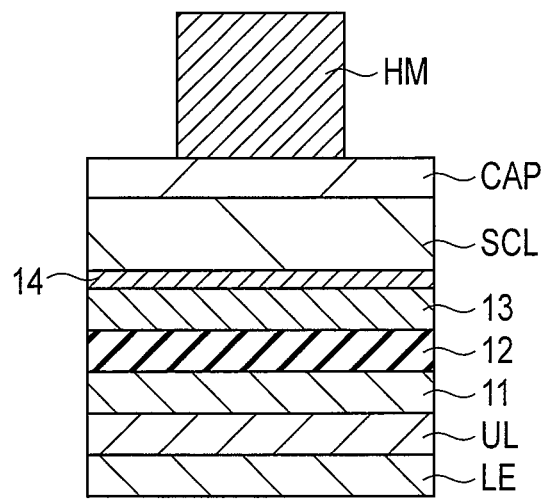
F I G. 2

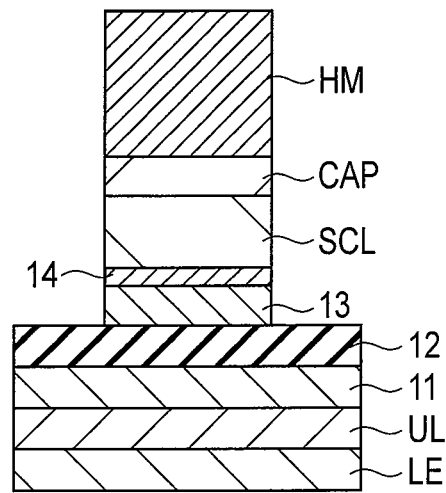
F I G. 5
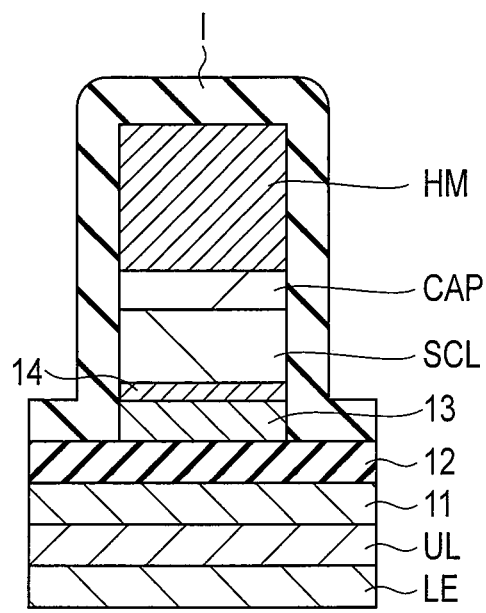
F I G. 6

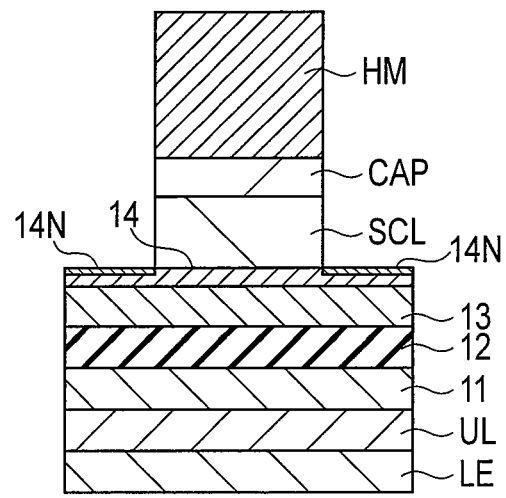
F I G. 11
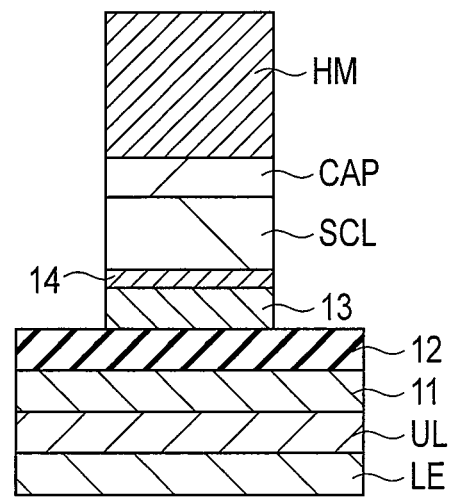
F I G. 12

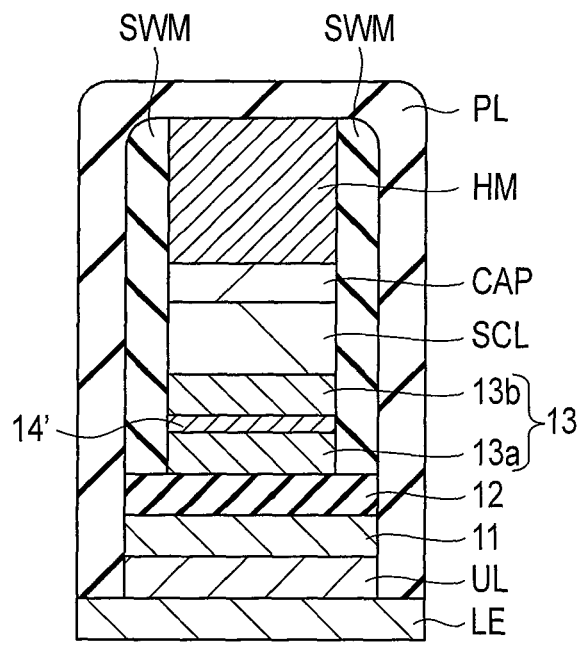
F I G. 13
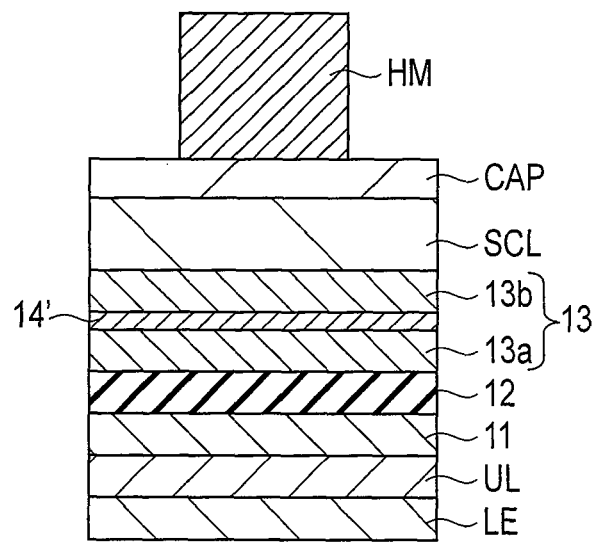
F I G. 14

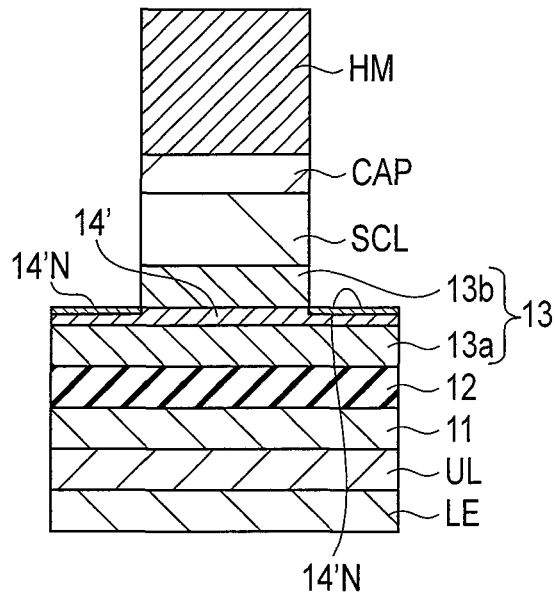
F I G. 15
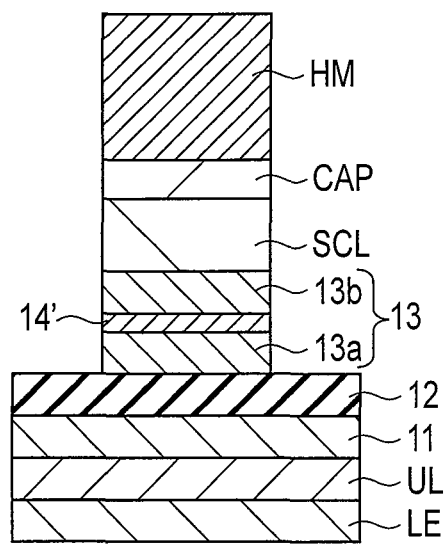
F I G. 16

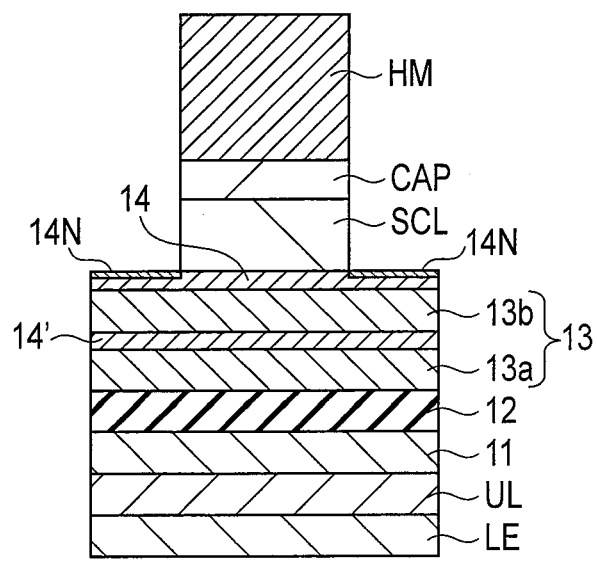
F I G. 19
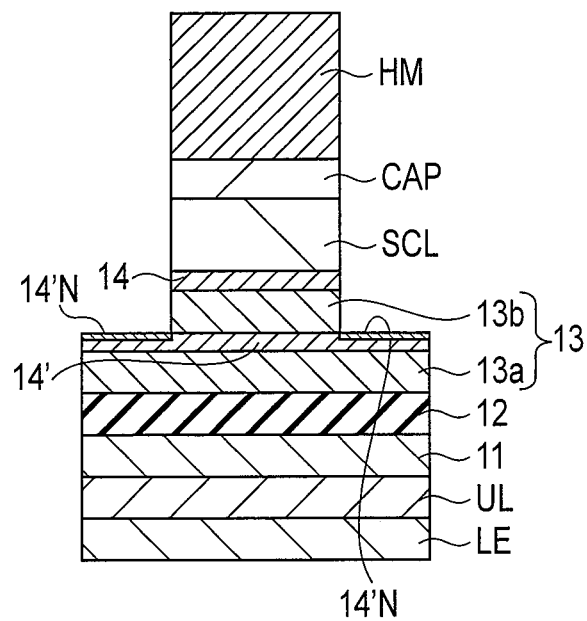
F I G. 20

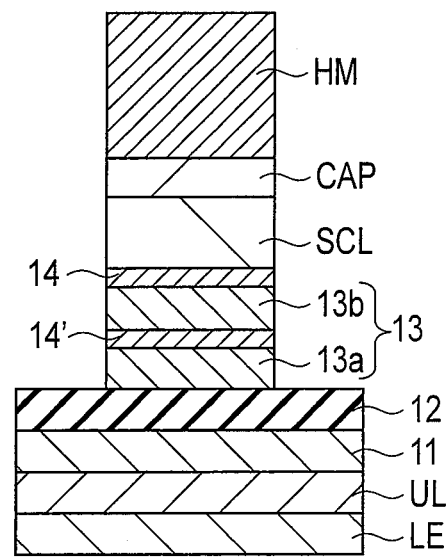
F I G. 21
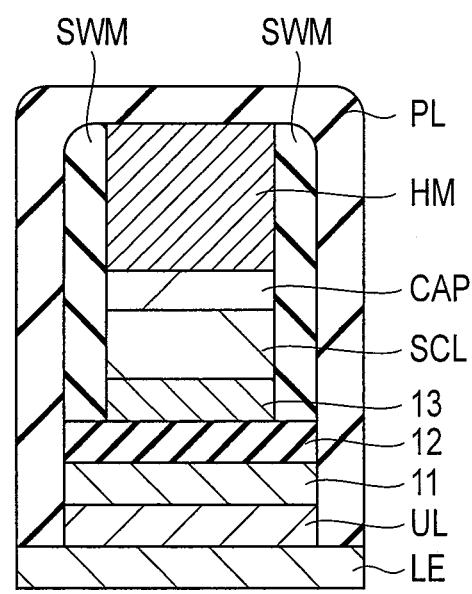
F I G. 22

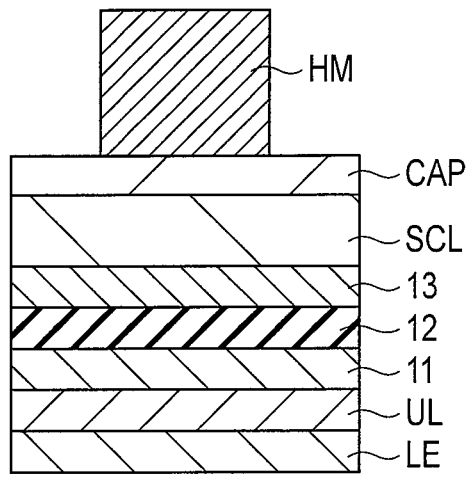
F I G. 23
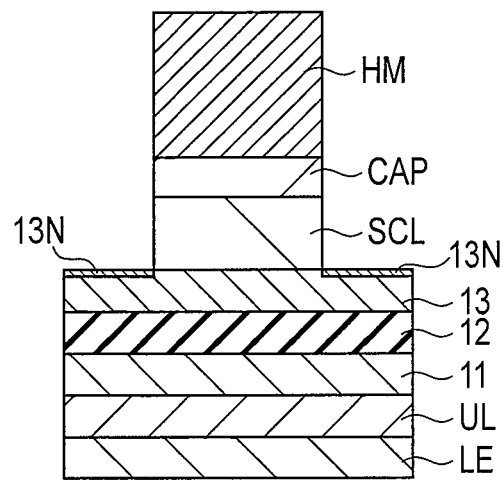
F I G. 24

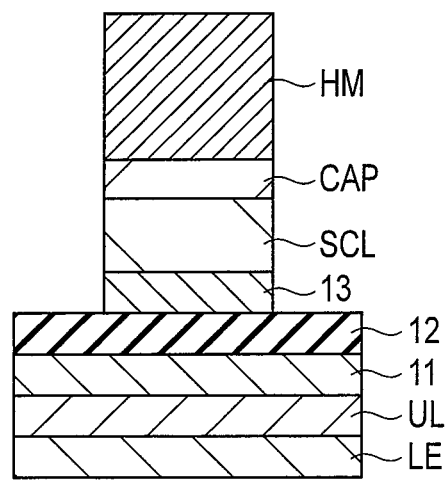
F I G. 25
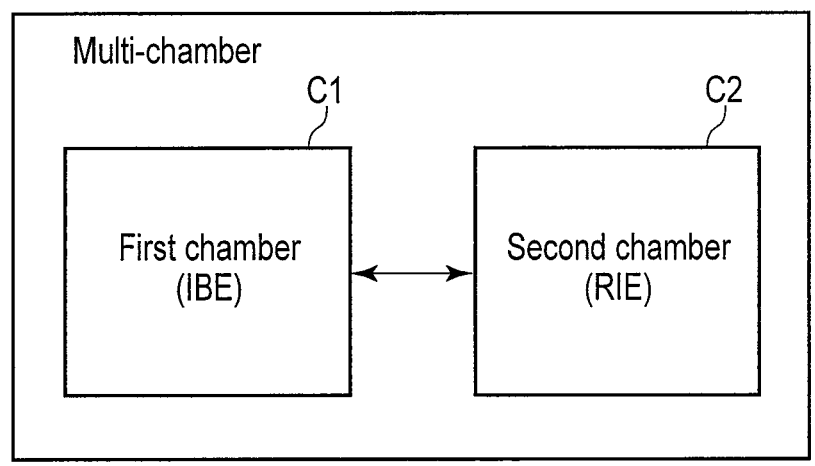
F I G. 26

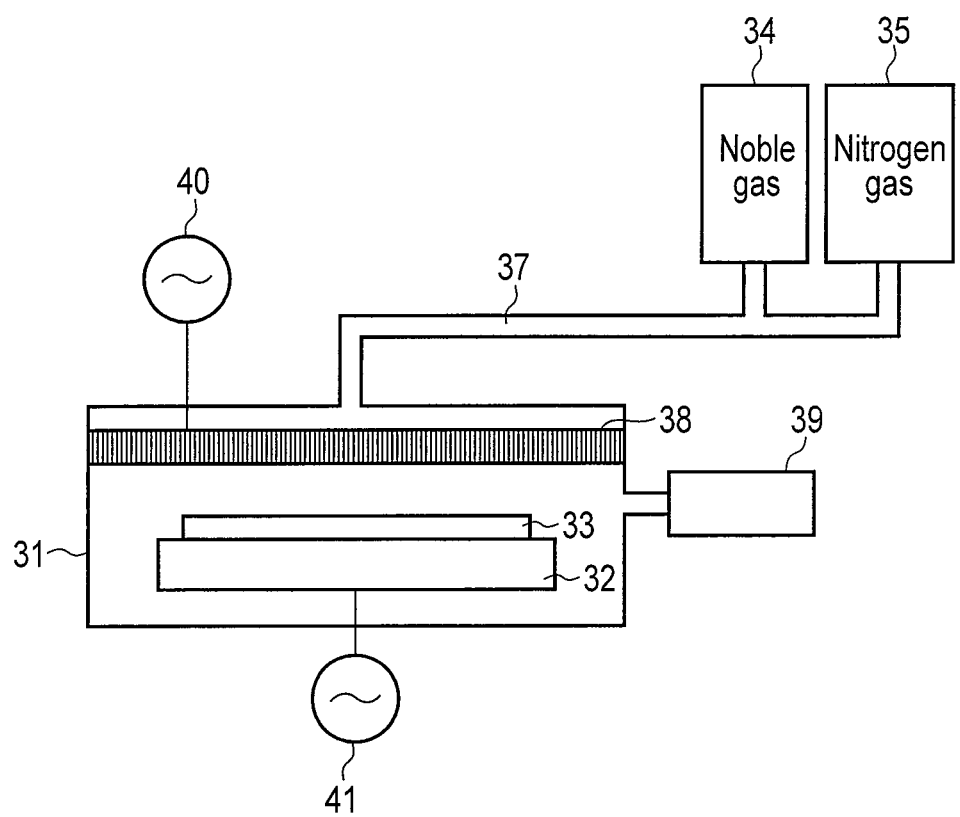
F I G. 29

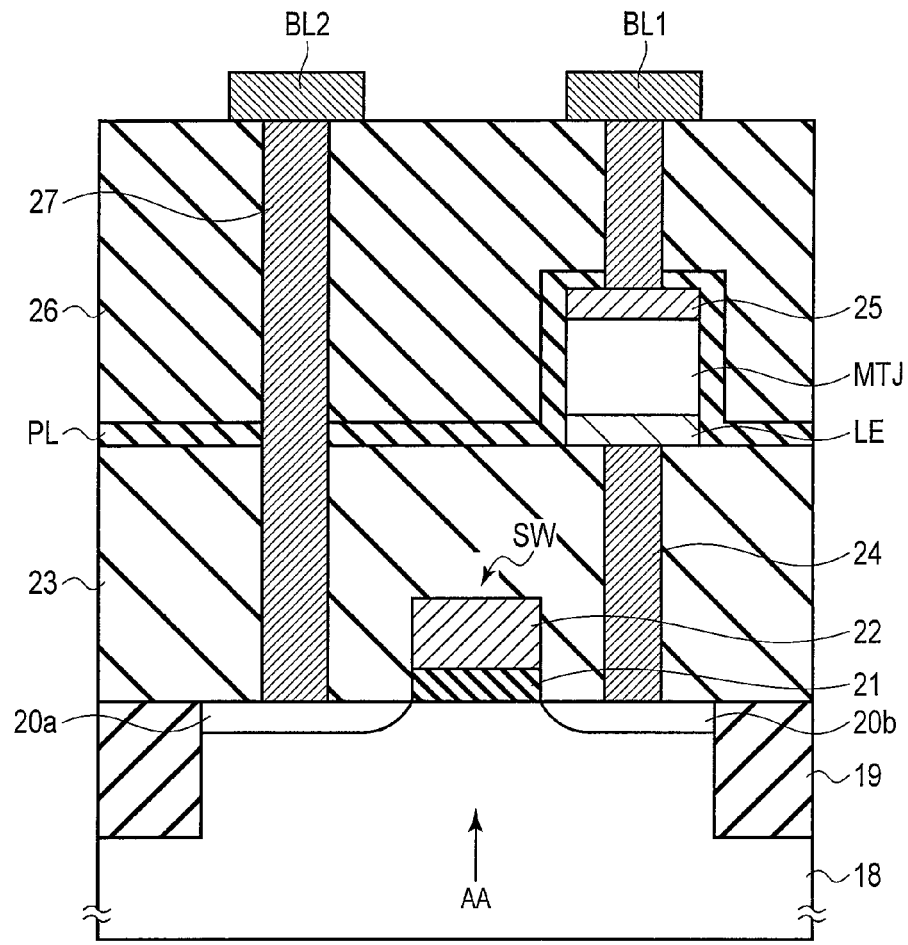
F I G. 31

METHOD OF MANUFACTURING MAGNETORESISTIVE ELEMENT

CROSS-REFERENCE TO RELATED APPLICATIONS

This application claims the benefit of U.S. Provisional Application No. 61/877,246, filed Sep. 12, 2013, the entire contents of which are incorporated herein by reference.

FIELD

Embodiments described herein relate generally to a method of manufacturing a magnetoresistive element.

BACKGROUND

An MRAM (magnetic random access memory) chip employed as a nonvolatile semiconductor storage uses a magnetoresistive element as a storage element. The magnetoresistive element has a structure in which a tunnel barrier layer (non-magnetic layer) is sandwiched between a storage layer (magnetic layer) and a reference layer (magnetic layer).

BRIEF DESCRIPTION OF THE DRAWINGS

FIG. 1 is a cross-sectional view showing an example of a magnetoresistive element;

FIG. 2 to FIG. 9 are cross-sectional views showing a manufacturing method of a first embodiment;

FIG. 10 to FIG. 12 are cross-sectional views showing a manufacturing method of a second embodiment;

FIG. 13 is a cross-sectional view showing an example of a magnetoresistive element;

FIG. 14 to FIG. 16 are cross-sectional views showing a manufacturing method of a third embodiment;

FIG. 18 to FIG. 21 are cross-sectional views showing a manufacturing method of a fourth embodiment;

FIG. 22 is a cross-sectional view showing an example of a magnetoresistive element;

FIG. 23 to FIG. 25 are cross-sectional views showing a manufacturing method of a fifth embodiment;

FIG. 26 to FIG. 28 are block diagrams showing an example of a multi-chamber;

FIG. 29 is an illustration showing an example of a manufacturing device executing RIE;

FIG. 31 is a cross-sectional view showing an example of a memory cell.

DETAILED DESCRIPTION

Figure 3:
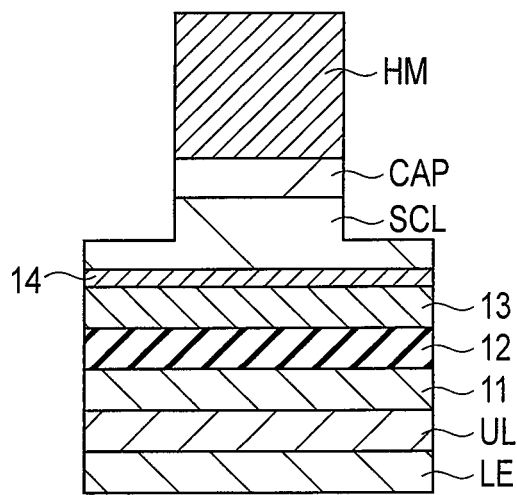

In general, according to one embodiment, a method of manufacturing a magnetoresistive element, the method comprises: forming a first non-magnetic layer on a first magnetic layer; forming a second magnetic layer on the first non-magnetic layer; forming a second non-magnetic layer on the second magnetic layer; forming a third magnetic layer on the second non-magnetic layer; patterning the third magnetic layer by a RIE using an etching gas including a noble gas and a nitrogen gas until a surface of the second non-magnetic layer is exposed; patterning the second non-magnetic layer and the second magnetic layer after patterning of the third magnetic layer; and patterning the first non-magnetic layer and the first magnetic layer after patterning the second magnetic layer.

The embodiments will be hereinafter described with reference to the attached drawings.

First Embodiment

Underlayer UL is disposed on lower electrode LE. First magnetic layer 11 is disposed on underlayer UL. Non-magnetic layer (tunnel barrier layer) 12 is disposed on first magnetic layer 11. Second magnetic layer 13 is disposed on non-magnetic layer 12. Non-magnetic layer (etching stopper layer) 14 is disposed on second magnetic layer 13. Shift cancel layer SCL is disposed on non-magnetic layer 14. Cap layer CAP is disposed on shift cancel layer SCL. Hard mask layer HM is disposed on cap layer CAP.

Side wall insulating layers (side wall mask layers) SWM are disposed on non-magnetic layer 12 to cover the side walls of hard mask layer HM, cap layer CAP, shift cancel layer SCL, non-magnetic layer 14 and second magnetic layer 13. Protective layer PL is formed on lower electrode LE to cover the magnetoresistive element.

One of first magnetic layer 11 and second magnetic layer 13 is a storage layer having variable magnetization while the other is a reference layer having invariable magnetization. First magnetic layer 11 and second magnetic layer 13 may be in a perpendicular magnetization type having perpendicular magnetization or an in-plane magnetization type having in-plane magnetization.

Shift cancel layer SCL can cancel a stray magnetic field from reference layer 13 applied to storage layer 11 when, for example, first magnetic layer 11 is a storage layer and second magnetic layer 13 is a reference layer. Therefore, for example, when the storage layer and the reference layer are in the perpendicular magnetization type, shift cancel layer SCL also comprises a magnetic layer in the perpendicular magnetization type.

The variable magnetization indicates that the direction of magnetization is variable to a predetermined rite current, and the invariable magnetization indicates that the direction of magnetization is invariable to a predetermined rite current.

First magnetic layer 11 and second magnetic layer 13 contain, for example, CoFeB. Shift cancel layer SCL contains, for example, any one of CoPt, CoFe, PtMn, and NiFe.

First magnetic layer 11, second magnetic layer 13 and shift cancel layer SCL may contain disordered alloy, artificial lattice, ferrimagnet or a combination thereof.

(1) Examples of Disordered Alloy

Alloy containing cobalt (Co) as a main component and at least one element of chrome (Cr), tantalum (Ta), niobium (Nb), vanadium (V), tungsten (W), hafnium (Hf), titanium (Ti), zirconium (Zr), platinum (Pt), palladium (Pd), iron (Fe), and nickel (Ni).

For example, CoCr alloy, CoPt alloy, CoCrTa alloy, CoCrPt alloy, CoCrPtTa alloy, CoCrNb alloy, etc. are included in this group. In these alloys, a magnetic anisotropy energy density and a saturation magnetization are controlled, based on a rate of non-magnetic elements.

(2) Examples of Artificial Lattice

Laminate formed by alternately stacking a layer of a metal containing at least one element of iron (Fe), cobalt (Co) and nickel (Ni) and a layer of a metal containing at least one element of chrome (Cr), platinum (Pt), palladium (Pd), iridium (Ir), rhodium (Rh), ruthenium (Ru), osmium (Os), rhenium (Re), gold (Au), and copper (Cu).

For example, Co/Pt artificial lattice, Co/Pd artificial lattice, CoCr/Pt artificial lattice, Co/Ru artificial lattice, Co/Os artificial lattice, Co/Au, Ni/Cu artificial lattice, and the like are included in this group. In these materials, A/B indicates alternately stacking two or more layers of A and B. In these artificial lattices, the magnetic anisotropy energy density and the saturation magnetization are controlled, based on the type of the elements added to the magnetic layers, a ratio in thickness between the magnetic layers and the non-magnetic layers, and the like.

(3) Examples of Ferrimagnet

Alloy of noble-earth metals and transition metals, and amorphous alloys containing, for example, terbium (Tb), dysprosium (Dy) or gadolinium (Gd), and at least one element of transition metals.

For example, TbFe, TbCo, TbFeCo, DyTbFeCo, GdTbCo, etc. are included in this group. In these alloys, the magnetic anisotropy energy density and the saturation magnetization are controlled, based on a composition ratio.

Hard mask layer HM contains, for example, one of W, Ta, TaN, Ti, TiN, Ru, C (containing diamond-like carbon and graphite carbon), Al, AlN and AlO. Cap layer CAP contains, for example, one of Pt, W, Ta and Ru.

Non-magnetic layer 12 serving as a tunnel barrier layer is an insulator and contains, for example, one of MgO and AlO. Non-magnetic layer 14 serving as an etching stopper layer is an insulator and contains, for example, one of Ta, W, Ti, Nb, Hf, Al and B.

Underlayer UL contains, for example, one of Hf, AlN, and TaAlN, and lower electrode LE contains, contains, for example, one of W, Ta, TaN, Ti, and TiN. Side wall insulating layers SWM and protective layer PL comprise insulator layers of, for example, silicon nitride, silicon oxide, etc.

A structure shown in FIG. 1 is formed by, for example, a first patterning process using hard mask layer HM as a mask and a second patterning process using hard mask layer HM and side wall insulating layers SWM as masks.

In the first patterning process, cap layer CAP, shift cancel layer SCL, non-magnetic layer 14 and second magnetic layer 13 are etched. In the second patterning process, non-magnetic layer 12, first magnetic layer 11 and underlayer UL are etched. Protective layer PL is formed after the first and second patterning processes.

In the first patterning process, stopping the etching of second magnetic layer 13 on the surface of non-magnetic layer (tunnel barrier layer) 12, what is called "stop on tunnel barrier", is important. This is because, if non-magnetic layer 12 is etched and first magnetic layer 11 is further etched in the first patterning process, once evaporated materials of first magnetic layer 11 and second magnetic layer 13 are re-deposited on the side walls of non-magnetic layer 12 and cause a short circuit to occur in first magnetic layer 11 and second magnetic layer 13.

In the first embodiment, non-magnetic layer 14 is disposed as an etching stopper layer on second magnetic layer 13 to certainly execute "stop on tunnel barrier". Thus, in the first patterning process, cap layer CAP, shift cancel layer SCL, non-magnetic layer 14 and second magnetic layer 13 are not sequentially etched at one time, but a first step of etching all portions of cap layer CAP and some portions of shift cancel layer SCL (up to a middle level), a second step of etching a remaining portion of shift cancel layer SCL, and a third step of etching non-magnetic layer 14 and second magnetic layer 13 are executed.

By thus dividing the first patterning process into three steps, "stop on tunnel barrier" may be certainly executed in the third step. In the third step, since non-magnetic layer 14 and second magnetic layer 13 having a sufficiently smaller thickness than a total thickness of cap layer CAP, shift cancel layer SCL, non-magnetic layer 14 and second magnetic layer 13 are only etched, "stop on tunnel barrier" can be certainly executed by control of the etching time, etc.

For example, a time to etch non-magnetic layer 14 and second magnetic layer 13 is set at a value at which they can be completely removed, i.e., an ideal value $+\alpha$, by considering variation in manufacturing, etc. In this case, too, since a total thickness of non-magnetic layer 14 and second magnetic layer 13 is sufficiently small, the value of $\alpha$ is also sufficiently small.

Therefore, even if the variation in manufacturing enables non-magnetic layer 12 serving as the tunnel barrier to be etched, at the worst, the portion of non-magnetic layer 12 which is not covered with hard mask layer HM is not thereby completely removed.

An interface layer (magnetic layer) may be disposed between non-magnetic layer 12 and second magnetic layer 13, in the first embodiment. However, the interface layer is sufficiently thinner than second magnetic layer 13.

In addition, in the first embodiment, the laminated structure on non-magnetic layer 12 serving as the tunnel barrier layer includes second magnetic layer 13, non-magnetic layer 14 and shift cancel layer SCL. However, shift cancel layer SCL may be a third magnetic layer different from shift cancel layer SCL. In other words, the laminated structure on non-magnetic layer 12 may be a structure of magnetic layer/non-magnetic layer/magnetic layer.

Incidentally, in the first embodiment, each of the first, second and third steps needs to be improved to execute the first patterning process at three steps as described above. Then, an example of a manufacturing method to obtain the structure shown in FIG. 1 will be hereinafter described. The first, second and third steps will be described in detail, in the example of the manufacturing method.

FIG. 2 to FIG. 9 show an example of a manufacturing method for obtaining the structure shown in FIG. 1.

First, underlayer UL is formed on lower electrode LE, first magnetic layer 11 is formed on underlayer UL, non-magnetic layer (tunnel barrier layer) 12 is formed on first magnetic layer 11, and second magnetic layer 13 is formed on non-magnetic layer 12, as shown in FIG. 2.

Subsequently, non-magnetic layer 14 and shift cancel layer SCL are formed on second magnetic layer 13, cap layer CAP is formed on shift cancel layer SCL, and hard mask layer HM is formed on cap layer CAP.

Next, the first patterning process is executed. The first patterning process comprises a first step, a second step and a third step.

First, the first step is executed as shown in FIG. 3. In the first step, all the portions of cap layer CAP are etched and some portions of shift cancel layer SCL are etched (up to a middle level), by using hard mask layer HM as a mask.

The etching is not specifically limited, but can be executed by physical etching, for example, IBE, RIE using a noble gas, a combination thereof, etc. It is desirable, however, that the gas used for the etching should not contain oxygen gas or an oxidizing gas such as oxygen compound gas to prevent oxidization of the magnetoresistive element.

An etching time of cap layer CAP and shift cancel layer SCL is controlled so as to prevent shift cancel layer SCL at a portion which is not covered with hard mask layer HM from being completely removed, in the first step. For example, the etching time may be shorter than an ideal value of an etching time to completely etch cap layer CAP and shift cancel layer SCL.

Consequently, all the portions of cap layer CAP are etched and some portions of shift cancel layer SCL are etched (up to a middle level), in the first step, as shown in FIG. 3.

Figure 4:
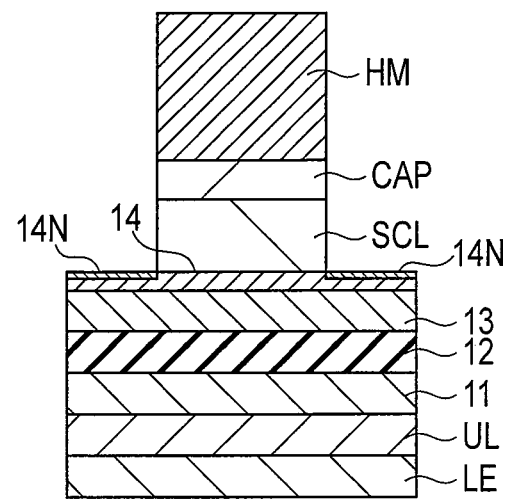

Next, the second step is executed as shown in FIG. 4. In the second step, a remainder of shift cancel layer SCL is etched by using hard mask layer HM as a mask.

This etching is executed for the purpose of certainly stopping the etching of shift cancel layer SCL when a surface of non-magnetic layer 14 serving as the etching stopper layer is exposed. For this reason, this etching is executed by RIE using a noble gas and a non-oxidizing gas which contains nitrogen gas. The non-oxidizing gas indicates a gas which does not contain oxygen gas or an oxidizing gas such as an oxygen compound gas.

A reason why the etching of shift cancel layer SCL can be certainly stopped by RIE using a noble gas and a non-oxidizing gas which contains nitrogen gas when the surface of non-magnetic layer 14 serving as the etching stopper layer is exposed, will be hereinafter explained.

The noble gas (for example, Ar gas) physically etches shift cancel layer SCL by colliding with shift cancel layer SCL. In other words, the noble gas is mainly used for the purpose of anisotropically etching shift cancel layer SCL.

In addition, nitrogen gas reacts with elements (Ta, W, Ti, Nb, Hf, Al, B, etc.) constituting non-magnetic layer 14 and forms nitride 14N, when the surface of non-magnetic layer 14 is exposed. Nitride 14N is formed to cover an overall surface of non-magnetic layer 14 when the surface of non-magnetic layer 14 is exposed. In other words, nitrogen gas is mainly used for the purpose of preventing the etching of non-magnetic layer 14, by forming nitride 14N serving as an etching protective layer on the surface of non-magnetic layer 14, in the second step.

For this reason, in the second step, the etching of shift cancel layer SCL can be certainly stopped when the surface of non-magnetic layer 14 serving as the etching stopper layer is exposed.

Non-magnetic layer 14 serves as the etching stopper layer in the second step as described above, but it is desirable that non-magnetic layer 14 should be set to have a thickness affecting no magnetic or electric characteristic of the magnetoresistive element, for example, a thickness of not greater than 1 nm.

Examples of etching conditions in the second step are described below:
[Conditions]
Noble gas: Ar gas (50 sccm-1,000 sccm)
Nitrogen gas: $N_2$ gas (5 sccm-200 sccm)
Bias power: 100 W-500 W
Pressure in chamber: 1 Pa-2 Pa (for example, 1.33 Pa)

Next, the third step is executed. In the third step, non-magnetic layer 14 and second magnetic layer 13 are etched by using hard mask layer HM as a mask. In this etching, non-magnetic layer 14 and second magnetic layer 13 have only to be etched as described above. Accordingly, the etching can be certainly stopped, i.e., "stop on barrier layer" can be implemented when a surface of non-magnetic layer 12 serving as the tunnel barrier layer is exposed, as shown in FIG. 5.

The etching is not specifically limited, but can be executed by physical etching, for example, IBE, RIE using a noble gas, a combination thereof, etc. It is desirable, however, that the gas used for the etching should not contain oxygen gas or an oxidizing gas such as oxygen compound gas to prevent oxidization of the magnetoresistive element.

Thus, in the first patterning process, "stop on barrier layer" can be certainly implemented in the patterning of the magnetoresistive element since the etching of cap layer CAP, shift cancel layer SCL, non-magnetic layer 14, and second magnetic layer 13 is executed in three steps, i.e., the first step, the second step and the third step.

Table 1 shows a summary of the first patterning process.

TABLE 1

| First Patterning process | | A |
|---|---|---|
| Upper layer | Cap layer CAP | RIE with noble gas or Ion beam etching (IEB) |
| Layer | Shift cancel layer SCL | RIE with noble gas and Nitrogen gas |
| | Non-magnetic layer 14 | RIE with noble gas or Ion beam etching (IBE) |
| Lower layer | Second magnetic layer 13 | |

Next, insulating layer (for example, silicon nitride) I to cover hard mask layer HM, cap layer CAP, shift cancel layer SCL, non-magnetic layer 14 and second magnetic layer 13 is formed by, for example, CVD, as shown in FIG. 6.

Figure 7:
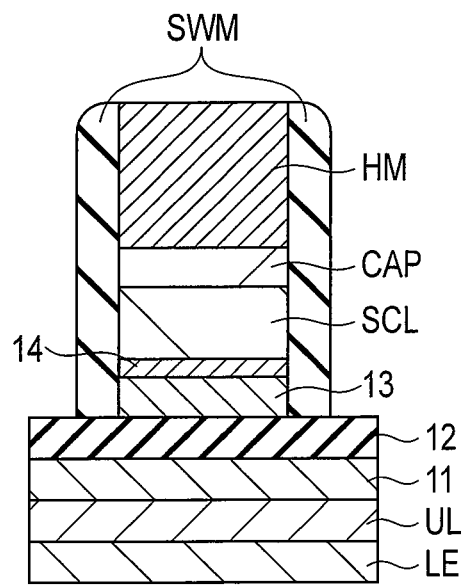

Subsequently, side wall insulating layers (side wall mask layers) SWM to cover side walls of hard mask layer HM, cap layer CAP, shift cancel layer SCL, non-magnetic layer 14 and second magnetic layer 13 are formed as shown in FIG. 7, by etching insulating layer I in the etching method such as IBE and RIE.

Figure 8:
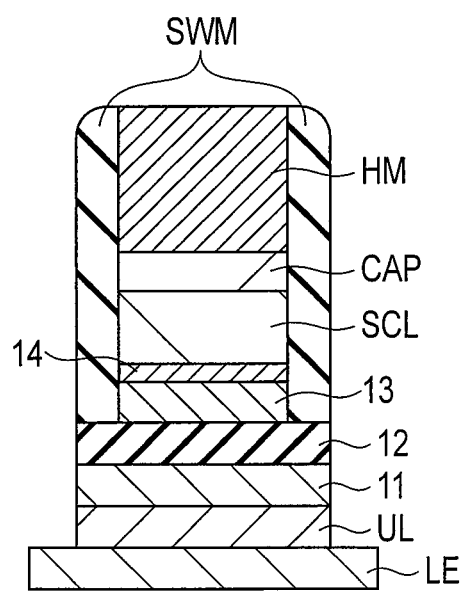

Next, the second patterning process is executed as shown in FIG. 8. In the second patterning process, non-magnetic layer 12, first magnetic layer 11 and underlayer UL are etched by using hard mask layer HM and side wall insulating layers SWM as masks.

The second patterning process is executed by a combination of the physical etching such as IBE and RIE using a noble gas.

Table 2 shows a combination of etching methods which can be selected in the second patterning process.

TABLE 2

| Second patterning process | | A | B | C | D |
|---|---|---|---|---|---|
| Upper layer | Non-magnetic layer 12 | | | IBE | |
| Layer | First magnetic layer 11 | IBE | RIE | | IBE |
| Lower layer | Foundation layer UL | | | RIE | RIE |

Since the second patterning process can be executed by a well-known technique, explanation of the second patterning process is omitted here.

Figure 9:
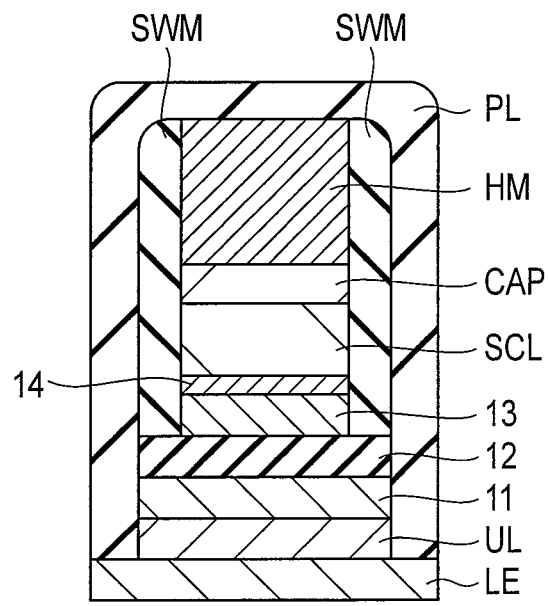

Finally, protective layer (for example, silicon nitride) PL to cover the magnetoresistive element is formed on lower electrode LE as shown in FIG. 9.

The structure shown in FIG. 1 is completed in the above-described steps.

According to the First Embodiment, the etching of second magnetic layer 13 can be certainly stopped on the surface of non-magnetic layer 12, i.e., what is called "stop on barrier layer" can be certainly implemented as compared with executing the first patterning process by the physical etching, for example, IBE, RIE using halogen gas, etc.

Second Embodiment

Second Embodiment is a modified example of the first patterning process of the First Embodiment. The Second Embodiment is characterized in that the first patterning process comprises a first step and a second step. In other words, the first patterning process is executed in two steps, in the Second Embodiment. Since the Second Embodiment is the same as the First Embodiment in view of the other portions, the first patterning process alone will be described here.

Figure 10:
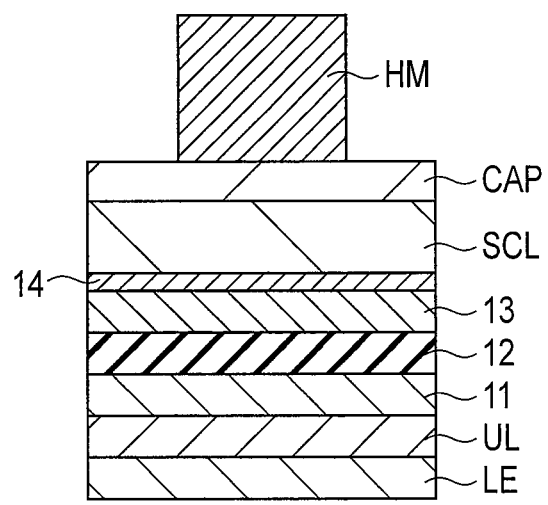

FIG. 10 to FIG. 12 show an example of a manufacturing method for obtaining the structure shown in FIG. 1.

First, underlayer UL is formed on lower electrode LE, first magnetic layer 11 is formed on underlayer UL, non-magnetic layer (tunnel barrier layer) 12 is formed on first magnetic layer 11, and second magnetic layer 13 is formed on non-magnetic layer 12, as shown in FIG. 10.

Subsequently, non-magnetic layer 14 and shift cancel layer SCL are formed on second magnetic layer 13, cap layer CAP is formed on shift cancel layer SCL, and hard mask layer HM is formed on cap layer CAP.

Next, the first patterning process is executed. The first patterning process comprises a first step and a second step.

First, the first step is executed as shown in FIG. 11. In the first step, cap layer CAP and shift cancel layer SCL are etched by using hard mask layer HM as a mask.

This etching is executed for the purpose of certainly stopping the etching of cap layer CAP and shift cancel layer SCL when a surface of non-magnetic layer 14 serving as the etching stopper layer is exposed. For this reason, this etching is executed by RIE using a noble gas and a non-oxidizing gas which contains nitrogen gas.

In this etching, nitride 14N of elements (Ta, W, Ti, Nb, Hf, Al, B, etc.) constituting non-magnetic layer 14 is formed on a surface of non-magnetic layer 14.

Next, the second step is executed. In the second step, non-magnetic layer 14 and second magnetic layer 13 are etched by using hard mask layer HM as a mask. In this etching, non-magnetic layer 14 and second magnetic layer 13 have only to be etched as described above. Accordingly, the etching can be certainly stopped when a surface of non-magnetic layer 12 serving as the tunnel barrier layer is exposed, i.e., "stop on barrier layer" can be implemented, as shown in FIG. 12.

Thus, in the first patterning process, "stop on barrier layer" can be certainly implemented in the patterning of the magnetoresistive element since the etching of cap layer CAP, shift cancel layer SCL, non-magnetic layer 14, and second magnetic layer 13 is executed in two steps, i.e., the first step and the second step.

Table 3 shows a summary of the first patterning process.

TABLE 3

| First Patterning process | | B |
| --- | --- | --- |
| Upper layer | Cap layer CAP | RIE with noble gas and Nitrogen gas |
| | Shift cancel layer SCL | |
| Lower layer | Non-magnetic layer 14 | RIE with noble gas or Ion beam etching (IBE) |
| | Second magnetic layer 13 | |

Since a subsequent process is the same as that in the First Embodiment (FIG. 6 to FIG. 9), an explanation of the subsequent process is omitted here.

The structure shown in FIG. 1 is completed in the above-described steps.

According to the Second Embodiment, the etching of second magnetic layer 13 can be certainly stopped on the surface of non-magnetic layer 12, i.e., what is called "stop on barrier layer" can be certainly implemented as compared with executing the first patterning process by the physical etching, for example, IBE, RIE using halogen gas, etc.

Third Embodiment

Third Embodiment is a modified embodiment of the First and Second Embodiments.

The Third Embodiment is characterized in that second magnetic layer 13 has first and second layers (magnetic layers) 13a and 13b and non-magnetic layer 14' is disposed as an etching stopper layer between first layer 13a and second layer 13b, as compared with the First and Second Embodiments.

In this case, non-magnetic layer 14 between second magnetic layer 13 and shift cancel layer SCL in the First and Second Embodiments (see FIG. 1) may be omitted or left as it is. In the Third Embodiment, an example of omitting non-magnetic layer 14 between second magnetic layer 13 and shift cancel layer SCL will be described. An example of leaving non-magnetic layer 14 between second magnetic layer 13 and shift cancel layer SCL as it is will be described in Fourth Embodiment.

FIG. 13 shows a magnetoresistive element according to the Third Embodiment.

Second magnetic layer 13 comprises first layer 13a on non-magnetic layer 12 serving as a tunnel barrier layer, non-magnetic layer 14' on first layer 13a, and second layer 13b on non-magnetic layer 14'. Shift cancel layer SCL is disposed on second layer 13b in second magnetic layer 13.

First layer 13a and second layer 13b contain, for example, CoFeB. In addition, first layer 13a and second layer 13b may contain the disordered alloy, artificial lattice, ferrimagnet, or a combination thereof.

Non-magnetic layer 14' serving as an etching stopper layer is a conductor and contains one of, for example, Ta, W, Ti, Nb, Hf, Al, and B. It is desirable that non-magnetic layer 14' should be set to have a thickness affecting no magnetic or electric characteristic of the magnetoresistive element, for example, a thickness of not greater than 1 nm.

Since the Third Embodiment is the same as the First and Second Embodiments in view of the other portions, the same components as those of the structure shown in FIG. 1 are denoted by the same reference numbers and their explanations are omitted here.

FIG. 14 to FIG. 16 show an example of a manufacturing method for obtaining the structure shown in FIG. 13.

First, underlayer UL is formed on lower electrode LE, first magnetic layer 11 is formed on underlayer UL, non-magnetic layer (tunnel barrier layer) 12 is formed on first magnetic layer 11, first layer 13a is formed on non-magnetic layer 12, non-magnetic layer (etching stopper layer) 14' is formed on first layer 13a, and second layer 13b is formed on non-magnetic layer 14', as shown in FIG. 14.

Subsequently, shift cancel layer SCL is formed on second layer 13b, cap layer CAP is formed on shift cancel layer SCL, and hard mask layer HM is formed on cap layer CAP.

Next, a first patterning process is executed. The process described in the First and Second Embodiments can be employed as the first patterning process.

Table 4 shows the first patterning process.

TABLE 4

| First Patterning process | | A |
|---|---|---|
| Upper layer | Cap layer CAP and Shift cancel layer SCL | RIE with noble gas, RIE with noble gas and Nitrogen gas, or Ion beam etching (IBE) |
| Layer | Second layer 13b in second magnetic layer 13 | RIE with noble gas and Nitrogen gas |
| Lower layer | Non-magnetic layer 14' | RIE with noble gas or Ion beam etching (IBE) |
| | First layer 13a in second magnetic layer 13 | |

The first patterning process can be executed in two or three steps as shown in Table 4.

Cap layer CAP and shift cancel layer SCL can be etched by physical etching, for example, IBE, RIE using a noble gas, RIE using a noble gas and nitrogen gas, etc. It is desirable, however, that the gas used for the etching should not contain oxygen gas or an oxidizing gas such as oxygen compound gas.

Similarly, an upper portion of second layer 13b in second magnetic layer 13 can be etched by physical etching, for example, IBE, RIE using a noble gas, RIE using a noble gas and nitrogen gas, etc. However, a lower portion of second layer 13b in second magnetic layer 13 is etched by the RIE using a noble gas and nitrogen gas.

In other words, at least the etching of the lower portion of second layer 13b is executed by the RIE using a noble gas and a non-oxidizing gas containing nitrogen gas, for the purpose of certainly stopping the etching of second layer 13b when a surface of non-magnetic layer 14' serving as the etching stopper layer is exposed. In this etching, nitride 14'N of elements (Ta, W, Ti, Nb, Hf, Al, B, etc.) constituting non-magnetic layer 14' is formed on the surface of non-magnetic layer 14' as described in the First and Second Embodiments.

Consequently, a structure shown in FIG. 15 can be obtained.

After this, non-magnetic layer 14' and first layer 13a are etched by using hard mask layer HM as a mask.

In this etching, non-magnetic layer 14' and first layer 13a have only to be etched.

Accordingly, the etching can be certainly stopped when a surface of non-magnetic layer 12 serving as the tunnel barrier layer is exposed, i.e., "stop on barrier layer" can be implemented, as shown in FIG. 16.

Since a subsequent process is the same as that in the First Embodiment (FIG. 6 to FIG. 9), an explanation of the subsequent process is omitted here.

The structure shown in FIG. 13 is completed in the above-described steps.

According to the Third Embodiment, the etching of second magnetic layer 13 can be certainly stopped on the surface of non-magnetic layer 12, i.e., what is called "stop on barrier layer" can be certainly implemented as compared with executing the first patterning process by the physical etching, for example, IBE, RIE using halogen gas, etc.

Fourth Embodiment

In Fourth Embodiment, non-magnetic layer 14 is further disposed between second magnetic layer 13 and shift cancel layer SCL in the Third Embodiment. In other words, two layers, non-magnetic layers 14 and 14' serving as etching stopper layers are disposed in this embodiment.

Figure 17:
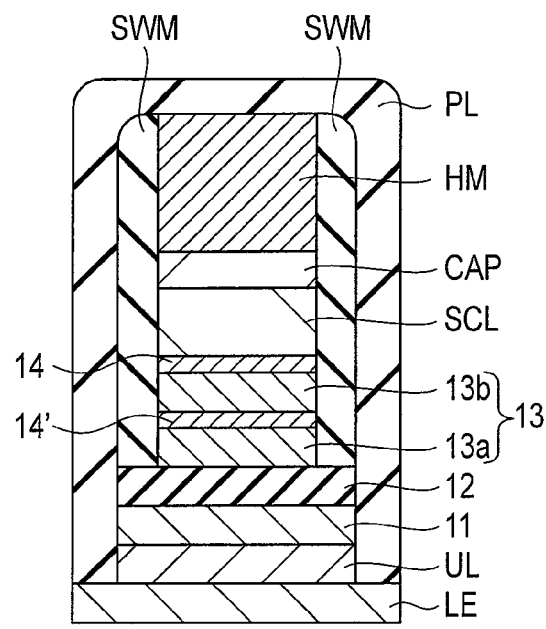
FIG. 17 is a cross-sectional view showing an example of a magnetoresistive element.

FIG. 17 shows a magnetoresistive element according to the Fourth Embodiment.

Second magnetic layer 13 comprises first layer 13a on non-magnetic layer 12 serving as a tunnel barrier layer, non-magnetic layer 14' on first layer 13a, and second layer 13b on non-magnetic layer 14'. Non-magnetic layer 14 is disposed on second layer 13b in second magnetic layer 13, and shift cancel layer SCL is disposed on non-magnetic layer 14.

Non-magnetic layers 14 and 14' serving as etching stopper layers are conductors and contain one of, for example, Ta, W, Ti, Nb, Hf, Al, and B. It is desirable that each of non-magnetic layers 14 and 14' should be set to have a thickness affecting no magnetic or electric characteristic of the magnetoresistive element, for example, a thickness of not greater than 1 nm.

Since the Fourth Embodiment is the same as the Third Embodiment in view of the other portions, the same components as those of the structure shown in FIG. 13 are denoted by the same reference numbers and their explanations are omitted here.

FIG. 18 to FIG. 21 show an example of a manufacturing method for obtaining the structure shown in FIG. 17.

Figure 18:
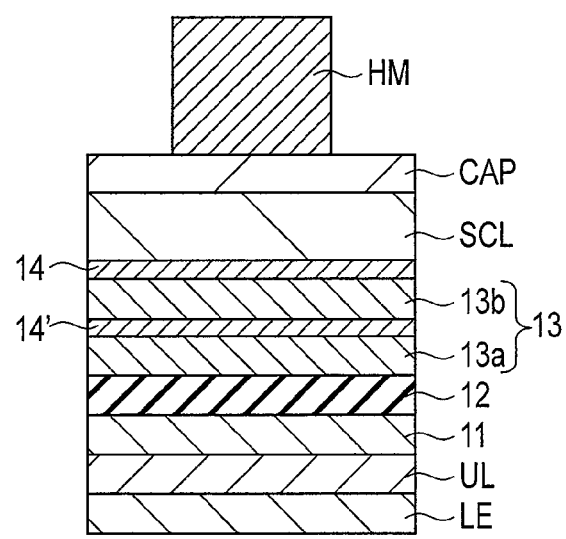

First, underlayer UL is formed on lower electrode LE, first magnetic layer 11 is formed on underlayer UL, non-magnetic layer (tunnel barrier layer) 12 is formed on first magnetic layer 11, first layer 13a is formed on non-magnetic layer 12, non-magnetic layer (etching stopper layer) 14' is formed on first layer 13a, and second layer 13b is formed on non-magnetic layer 14', as shown in FIG. 18.

Subsequently, non-magnetic layer (etching stopper layer) 14 is formed on second layer 13b, shift cancel layer SCL is formed on non-magnetic layer 14, cap layer CAP is formed on shift cancel layer SCL, and hard mask layer HM is formed on cap layer CAP.

Next, a first patterning process is executed. The process described in the First and Second Embodiments can be employed as the first patterning process.

Table 5 shows the first patterning process.

TABLE 5

| First Patterning process | | A |
|---|---|---|
| Upper layer | Cap layer CAP and Shift cancel layer SCL | RIE with noble gas, RIE with noble gas and Nitrogen gas, or Ion beam etching (IBE) |
| | | RIE with noble gas and Nitrogen gas |
| Layer | Non-magnetic layer 14 | RIE with noble gas, RIE with noble gas and Nitrogen gas, or Ion beam etching (IBE) |
| | Second layer 13b in second magnetic layer 13 | RIE with noble gas and Nitrogen gas |
| Lower layer | Non-magnetic layer 14' | RIE with noble gas or Ion beam etching (IBE) |
| | First layer 13a in second magnetic layer 13 | |

The first patterning process can be executed in two to five steps as shown in Table 5.

First, cap layer CAP and an upper portion of shift cancel layer SCL are etched by physical etching, for example, IBE, RIE using a noble gas, RIB using a noble gas and nitrogen gas, etc. as shown in FIG. 19. A lower portion of shift cancel layer SCL is etched by the RIE using a noble gas and nitrogen gas. It is desirable that the gas used for the etching should not contain oxygen gas or an oxidizing gas such as oxygen compound gas.

In the etching of the lower portion of shift cancel layer SCL, nitride 14N of elements (Ta, W, Ti, Nb, Hf, Al, B, etc.) constituting non-magnetic layer 14 is formed on the surface of non-magnetic layer 14 when the surface of non-magnetic layer 14 is exposed. Accordingly, the etching of the lower portion of shift cancel layer SCL can be certainly stopped when the surface of non-magnetic layer 14 serving as the etching stopper layer is exposed.

Next, non-magnetic layer 14 and an upper portion of second layer 13b are etched by physical etching, for example, IBE, RIE using a noble gas, RIE using a noble gas and nitrogen gas, etc. as shown in FIG. 20. A lower portion of second layer 13b is etched by the RIE using a noble gas and nitrogen gas. It is desirable that the gas used for the etching should not contain oxygen gas or an oxidizing gas such as oxygen compound gas.

In the etching of the lower portion of second layer 13b, nitride 14'N of elements (Ta, W, Ti, Nb, Hf, Al, B, etc.) constituting non-magnetic layer 14' is formed on the surface of non-magnetic layer 14' when the surface of non-magnetic layer 14' is exposed. Accordingly, the etching of the lower portion of second layer 13b can be certainly stopped when the surface of non-magnetic layer 14' serving as the etching stopper layer is exposed.

Next, non-magnetic layer 14' and first layer 13a are etched by using hard mask layer HM as a mask as shown in FIG. 21.

In this etching, non-magnetic layer 14' and first layer 13a have only to be etched.

Accordingly, the etching can be certainly stopped when a surface of non-magnetic layer 12 serving as the tunnel barrier layer is exposed, i.e., "stop on barrier layer" can be implemented.

Since a subsequent process is the same as that in the First Embodiment (FIG. 6 to FIG. 9), an explanation of the subsequent process is omitted here.

The structure shown in FIG. 17 is completed in the above-described steps.

According to the Fourth Embodiment, the etching of second magnetic layer 13 can be certainly stopped on the surface of non-magnetic layer 12, i.e., what is called "stop on barrier layer" can be certainly implemented as compared with executing the first patterning process by the physical etching, for example, IBE, RIE using halogen gas, etc.

Fifth Embodiment

In Fifth Embodiment, unlike the First to Fourth Embodiments, a non-magnetic layer serving as an etching stopper layer is not deposited.

In the present embodiment, a magnetic or electric property of a magnetoresistive element can be enhanced since the non-magnetic layer serving as an etching stopper layer is not deposited.

However, since certainly executing what is called "stop on barrier layer" in the magnetoresistive element is a common gist of the First to Fifth Embodiments, the present embodiment proposes a method of certainly stopping, for example, etching of a shift cancel layer (third magnetic layer) by RIE using an etching gas containing a noble gas and nitrogen gas, when a surface of a second magnetic layer is exposed, even if a non-magnetic layer serving as an etching stopper layer is not disposed.

FIG. 22 shows a magnetoresistive element according to the Fifth Embodiment.

This structure is characterized in that non-magnetic layer 14 serving as the etching stopper layer is omitted in the structure of the First and Second Embodiments (FIG. 1).

In the present embodiment, since the etching stopper layer is omitted, second magnetic layer 13 can secure an etching selection ratio to shift cancel layer (third magnetic layer) SCL, and comprises a material of which a nitride can be easily formed with nitrogen gas. It is desirable that the etching selection ratio between second magnetic layer 13 and shift cancel layer SCL should be equal to or greater than 150.

Second magnetic layer 13 comprises, for example, CoFeX as the material satisfying such a condition, where X is one of Ta, W, Ti, Nb, Hf, Al, and B. In this case, if shift cancel layer SCL is one of CoPt, CoFe, PtMn and NiFe, the etching selection ratio between second magnetic layer 13 and shift cancel layer SCL can be set to be equal to or greater than 150, at etching shift cancel layer SCL by the RIE using an etching gas containing a noble gas and nitrogen gas.

Since the Fifth Embodiment is the same as the First and Second Embodiments (FIG. 1) in view of the other portions, the same components as those of the structure shown in FIG. 1 are denoted by the same reference numbers and their explanations are omitted here.

FIG. 23 to FIG. 25 show an example of a manufacturing method for obtaining the structure shown in FIG. 22.

First, underlayer UL is formed on lower electrode LE, first magnetic layer 11 is formed on underlayer UL, non-magnetic layer (tunnel barrier layer) 12 is formed on first magnetic layer 11, and second magnetic layer 13 is formed on non-magnetic layer 12 as shown in FIG. 23.

Subsequently, shift cancel layer SCL is formed on second layer 13, cap layer CAP is formed on shift cancel layer SCL, and hard mask layer HM is formed on cap layer CAP.

Next, a first patterning process is executed. The process described in the First and Second Embodiments can be employed as the first patterning process.

Table 6 shows the first patterning process.

TABLE 6

| First Patterning process | | B |
|---|---|---|
| Upper layer | Cap layer CAP | RIE with noble, RIE with noble gas ans Nitrogen gas, or Ion beam etching (IBE) |
| Layer | Shift cancel layer SCL | RIE with noble gas and Nitrogen gas |
| Lower layer | Second magnetic layer 13 | RIE with noble gas or Ion beam etching (IBE) |

The first patterning process can be executed in two to five steps as shown in Table 6.

First, cap layer CAP and an upper portion of shift cancel layer SCL are etched by physical etching, for example, IBE, RIE using a noble gas, RIE using a noble gas and nitrogen gas, etc. as shown in FIG. 24. A lower portion of shift cancel layer SCL is etched by the RIE using a noble gas and nitrogen gas. It is desirable that the gas used for the etching should not contain oxygen gas or an oxidizing gas such as oxygen compound gas.

In the etching of the lower portion of shift cancel layer SCL, nitride 13N of elements (Ta, W, Ti, Nb, Hf, Al, B, etc.)

constituting second magnetic layer 13 is formed on the surface of second magnetic layer 13 when the surface of second magnetic layer 13 is exposed.

For example, when second magnetic layer 13 is CoFeB, nitride (BN) 13N of boron (B) is formed on the surface of second magnetic layer 13. When second magnetic layer 13 is CoFeTa, nitride (TaN) 13N of tantalum (Ta) is formed on the surface of second magnetic layer 13.

Accordingly, the etching of the lower portion of shift cancel layer SCL can be certainly stopped when the surface of second magnetic layer 13 is exposed, even if the etching stopper layer is not disposed.

Next, second magnetic layer 13 is etched by using hard mask layer HM as a mask as shown in FIG. 25. In this etching, second magnetic layer 13 has only to be etched.

Accordingly, the etching of second magnetic layer 13 can be certainly stopped when a surface of non-magnetic layer 12 serving as the tunnel barrier layer is exposed, i.e., "stop on barrier layer" can be implemented.

Since a subsequent process is the same as that in the First Embodiment (FIG. 6 to FIG. 9), an explanation of the subsequent process is omitted here.

The structure shown in FIG. 22 is completed in the above-described steps.

According to the Fifth Embodiment, the etching of second magnetic layer 13 can be certainly stopped on the surface of non-magnetic layer 12, i.e., what is called "stop on barrier layer" can be certainly implemented as compared with executing the first patterning process by the physical etching, for example, IBE, RIE using halogen gas, etc.

Sixth Embodiment

In Sixth Embodiment, an example of a manufacturing apparatus for executing the first patterning process according to the First to Fifth Embodiments will be described.

In the First to Fifth Embodiments, the first patterning process comprises at least two steps. To execute the at least two steps, the manufacturing apparatus according to the present embodiment comprises first chamber C1 in which a first step, for example, physical etching is executed, and second chamber C2 in which a second step, for example, RIE is executed, as shown in, for example, FIG. 26. In other words, it is desirable that the manufacturing method according to the First to Fifth Embodiments should be executed in a multi-chamber shown in FIG. 26.

The multi-chamber enables the magnetoresistive element (wafer) to be conveyed between first chamber C1 and second chamber C2 in a state in which the magnetoresistive element is not exposed to air, i.e., a state in which the magnetoresistive element is not oxidized.

Figure 27:
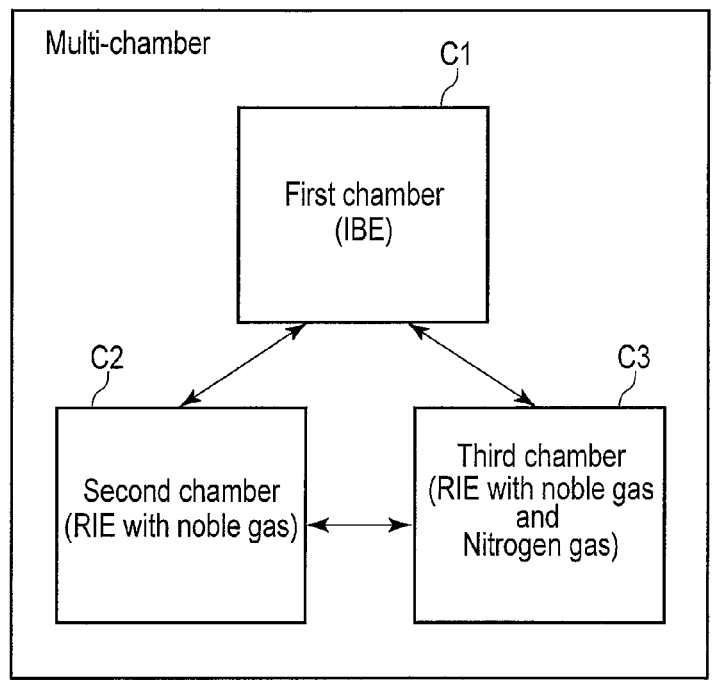

In addition, the manufacturing method according to the First to Fifth Embodiments can also be executed in a multi-chamber shown in FIG. 27.

For example, employment of three different etching methods, i.e., physical etching, RIE using a noble gas and RIE using an etching gas containing a noble gas and nitrogen gas in these embodiments is considered here.

In this case, it is desirable that the first patterning process should be executed in a multi-chamber comprising first chamber C1 in which physical etching is executed, second chamber C2 in which RIE using a noble gas is executed, and third chamber C3 in which RIE using a noble gas and an etching gas containing nitrogen gas is executed.

The multi-chamber enables the magnetoresistive element (wafer) to be conveyed among first chamber C1, second chamber C2 and third chamber C3 in a state in which the magnetoresistive element is not exposed to air, i.e., a state in which the magnetoresistive element is not oxidized.

However, the RIE using a noble gas and the RIE using a noble gas and nitrogen gas can be executed in the same chamber since a difference between the RIEs is containing nitrogen gas or not alone.

Figure 28:
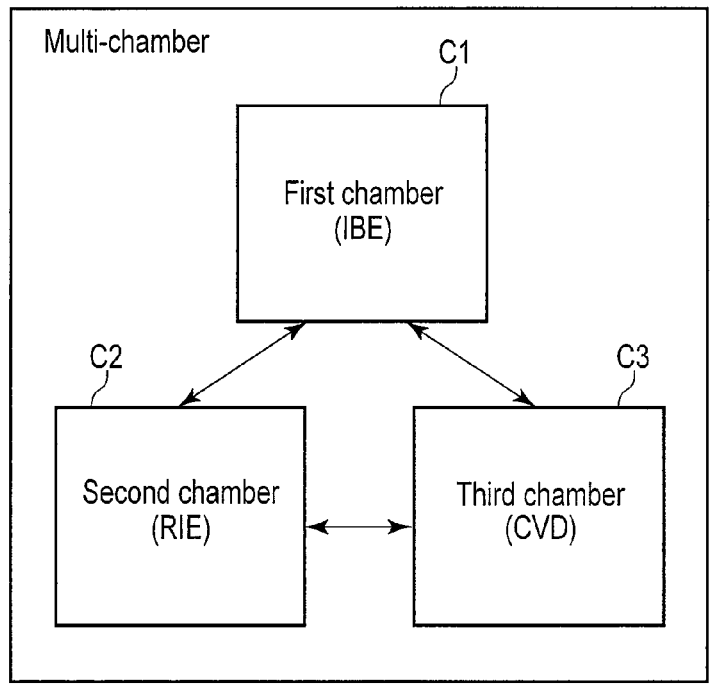

The process can be modified to executing the physical etching in first chamber C1, executing RIE in second chamber C2, and executing CVD in third chamber C3 as shown in FIG. 28. In this case, third chamber C3 is used for, for example, a process for forming insulating layer I in FIG. 6.

FIG. 29 shows an example of a chamber in which RIE is executed.

Wafer 33 is placed on wafer table (electrode) 32 in chamber 31. A noble gas and nitrogen gas are supplied from gas supply modules 34 and 35, respectively, into chamber 31, through gas pipe 37. These gases are delivered evenly on a surface of wafer 33 by shower plate (electrode) 38.

A pressure in chamber 31 is measured by pressure gauge 39. Radio frequency power supplies 40 and 41 are connected to wafer table 32 and shower plate 38, respectively.

Then, RIE is executed by forming plasma of an etching gas in chamber 31 and accelerating ions of the etching gas toward wafer 33 while controlling electric powers of radio frequency power supplies 40 and 41 and the pressure in chamber 31.

If a noble gas is supplied into such a chamber, for example, chamber 31, the RIE using the noble gas can be executed. In addition, if a noble gas and nitrogen gas are supplied into such a chamber, for example, chamber 31, RIE using the noble gas and nitrogen gas can be executed.

In addition, an amount of generation of the nitride can be controlled in the first patterning process by controlling a flow rate of the nitrogen gas.

(Example of Application)

Application of the magnetoresistive element according to the above-described embodiments to a magnetic random access memory will be described here.

A 1T-1MTJ type memory cell array wherein a memory cell comprises a magnetoresistive element and a select transistor will be hereinafter described as an example of the application.

Figure 30:
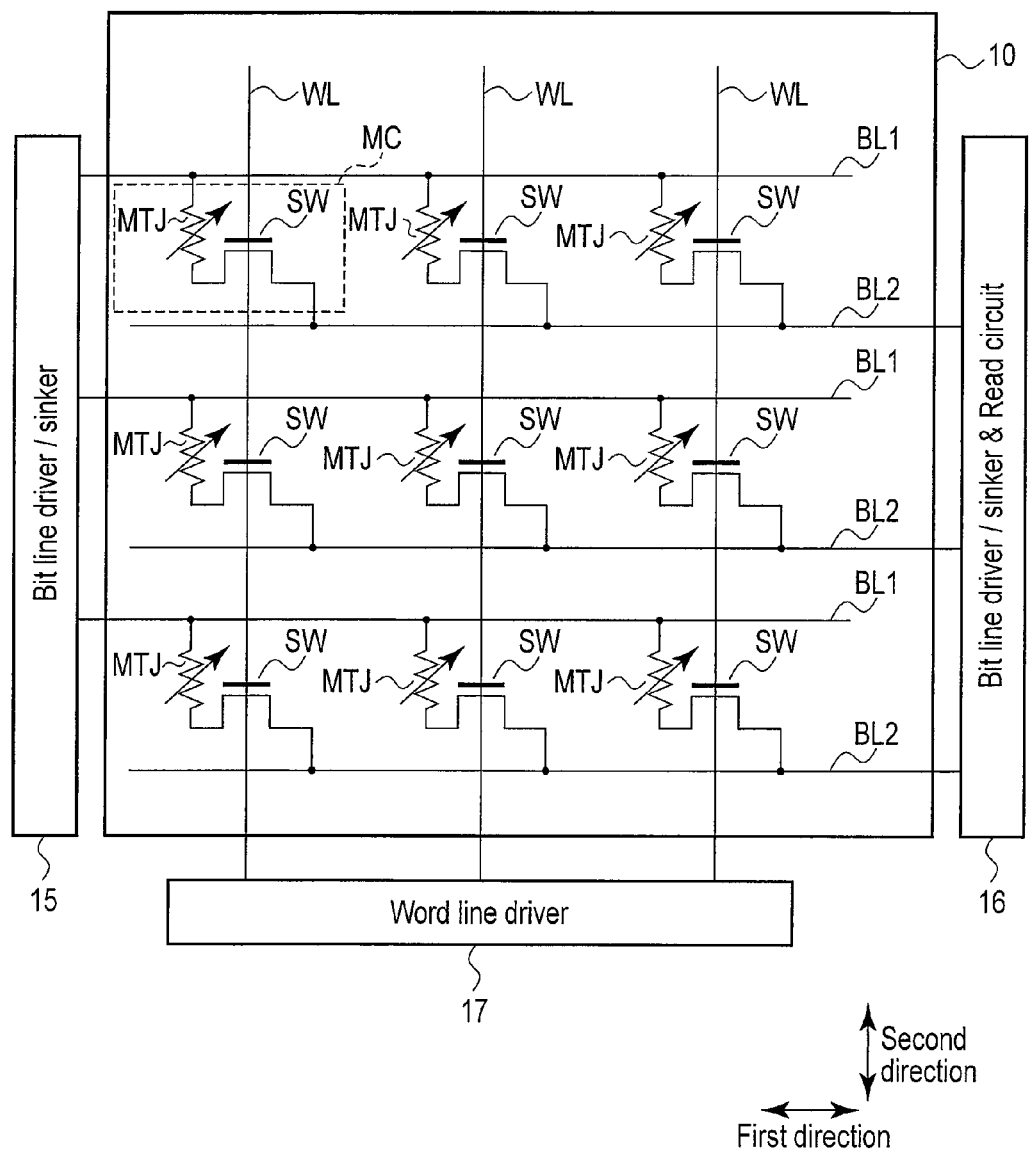
FIG. 30 is a block diagram showing an example of a magnetic random access memory.

FIG. 30 shows an example of an equivalent circuit of the 1T-1MTJ type memory cell array.

Memory cell array 10 comprises arrayed memory cells MC. Each of memory cells MC comprises magnetoresistive element MTJ and select transistor (FET) SW.

Magnetoresistive element MTJ and select transistor (FET) SW are serially connected, having one-side ends connected to first bit line BL1 and the other-side ends connected to second bit line BL2. A control terminal (gate terminal) of select transistor SW is connected to word line EL.

First bit line BL1 extends in a first direction, having an end connected to bit line driver/sinker 15. Second bit line BL2 extends in the first direction, having an end connected to bit line driver/sinker and read circuit 16.

However, the circuit, can be modified such that first bit line BL1 is connected to bit line driver/sinker and read circuit 16 and second bit line BL2 is connected to bit line driver/sinker 15.

In addition, bit line driver/sinker 15 and bit line driver/sinker and read circuit 16 may be disposed at positions opposite to each other or the same position.

Word line WL extends in a second direction, having an end connected to word line driver 17.

FIG. 31 shows an example of the memory cell.

Select transistor SW is disposed in active area AA in semiconductor substrate 18. Active area AA is surrounded by element isolating/insulating layer 19 in semiconductor substrate 18. In this example, element isolating/insulating layer 19 has an STI (Shallow Trench Isolation) structure.

Select transistor SW comprises source/drain diffusion layers 20a and 20b in semiconductor substrate 18, gate insulation layer 21 on a channel between the layers, and gate electrode 22 on gate insulation layer 21. Gate electrode 22 functions as word line WL.

Interlayer insulation layer 23 covers select transistor SW. A top surface of interlayer insulation layer 23 is flat, and lower electrode LE is disposed on interlayer insulation layer 23. Lower electrode LE is connected to source/drain diffusion layer 20b of select transistor SW via contact plug 24.

Magnetoresistive element MTJ is disposed on lower electrode LE. Upper electrode 25 is disposed on magnetoresistive element MTJ. Upper electrode 25 functions as, for example, hard mask HM to be used at processing magnetoresistive element MTJ.

Protective layer PL covers the side walls of magnetoresistive element MTJ.

Interlayer insulation layer 26 is disposed on protective layer PL to cover magnetoresistive element MTJ. A top surface of interlayer insulation layer 26 is flat, and first bit line BL1 and second bit line BL2 are disposed on interlayer insulation layer 26. First bit line BL1 is connected to upper electrode 25. Second bit line BL2 is connected to source/drain diffusion layer 20a of select transistor SW via contact plug 27.

CONCLUSION

According to the above-described embodiments, etching the magnetic layer alone disposed on the tunnel barrier layer, i.e., stopping the etching on the tunnel barrier layer surface (what is called "stop on tunnel barrier") can be certainly executed, at the two-step patterning of the magnetoresistive element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a magnetoresistive element, the method comprising:
   forming a first non-magnetic layer on a first magnetic layer;
   forming a second magnetic layer on the first non-magnetic layer;
   forming a second non-magnetic layer on the second magnetic layer;
   forming a third magnetic layer on the second non-magnetic layer;
   patterning the third magnetic layer by a RIE using an etching gas including a noble gas and a nitrogen gas until a surface of the second non-magnetic layer is exposed;
   patterning the second non-magnetic layer and the second magnetic layer after patterning of the third magnetic layer; and
   patterning the first non-magnetic layer and the first magnetic layer after patterning the second magnetic layer.

2. The method of claim 1, further comprising:
   forming a nitrogen compound of a nitrogen in the nitrogen gas and an element in the second non-magnetic layer on the surface of the second non-magnetic layer, when the surface of the second non-magnetic layer is exposed in the patterning of the third magnetic layer.

3. The method of claim 1, further comprising:
   patterning the second non-magnetic layer and the second magnetic layer by one of a RIE using an etching gas including a noble gas and not including a nitrogen gas, and a physical etching.

4. The method of claim 1, further comprising:
   patterning a lower portion of the third magnetic layer by the RIE using the etching gas including the noble gas and the nitrogen gas until the surface of the second non-magnetic layer is exposed, after patterning an upper portion of the third magnetic layer by one of a RIE using an etching gas including a noble gas and not including a nitrogen gas, and a physical etching.

5. The method of claim 1, wherein
   the etching gas does not include an oxygen gas and a oxygen compound gas.

6. The method of claim 1, wherein
   the first magnetic layer is a storage layer with a perpendicular and variable magnetization, and
   the second magnetic layer is a reference layer with a perpendicular and invariable magnetization.

7. The method of claim 1, wherein
   the second non-magnetic layer includes one of Ta, W, Ti, Nb, Hf, Al, and B.

8. The method of claim 1, further comprising:
   forming a sidewall insulating layer on a sidewall of the second magnetic layer after patterning the second magnetic layer; and
   patterning the first magnetic layer after forming the sidewall insulating layer.

9. The method of claim 1, further comprising:
   patterning the second non-magnetic layer and the second magnetic layer in a chamber by changing a gas in the chamber, after patterning the third magnetic layer in the chamber.

10. The method of claim 1, further comprising:
    patterning the third magnetic layer in a first chamber;
    transferring the magnetoresistive element from the first chamber to a second chamber in a state of being non-oxidized the magnetoresistive element; and
    patterning the second non-magnetic layer and the second magnetic layer in the second chamber.

11. A method of manufacturing a magnetoresistive element, the method comprising:
    forming a non-magnetic layer on a first magnetic layer;
    forming a second magnetic layer on the non-magnetic layer, the second magnetic layer including CoFeX, where X is one of Ta, W, Ti, Nb, Hf, Al, and B;
    forming a third magnetic layer on the second magnetic layer;
    patterning the third magnetic layer by a RIE using an etching gas including a noble gas and a nitrogen gas until a surface of the second magnetic layer is exposed;
    patterning the second magnetic layer after patterning of the third magnetic layer; and
    patterning the non-magnetic layer and the first magnetic layer after patterning the second magnetic layer.

12. The method of claim 11, further comprising:
    forming a nitrogen compound of a nitrogen in the nitrogen gas and an element in the second magnetic layer on the surface of the second magnetic layer, when the surface of the second magnetic layer is exposed in the patterning of the third magnetic layer.

13. The method of claim 11, further comprising:
patterning the second magnetic layer by one of a RIE using an etching gas including a noble gas and not including a nitrogen gas, and a physical etching.

14. The method of claim 11, further comprising:
patterning a lower portion of the third magnetic layer by the RIE using the etching gas including the noble gas and the nitrogen gas until the surface of the second magnetic layer is exposed, after patterning an upper portion of the third magnetic layer by one of a RIE using an etching gas including a noble gas and not including a nitrogen gas, and a physical etching.

15. The method of claim 11, wherein
the etching gas does not include an oxygen gas and a oxygen compound gas.

16. The method of claim 11, wherein
the first magnetic layer is a storage layer with a perpendicular and variable magnetization, and the second magnetic layer is a reference layer with a perpendicular and invariable magnetization.

17. The method of claim 16, wherein
the third magnetic layer is a shift cancelling layer.

18. The method of claim 11, further comprising:
forming a sidewall insulating layer on a sidewall of the second magnetic layer after patterning the second magnetic layer; and
patterning the first magnetic layer after forming the sidewall insulating layer.

19. The method of claim 11, further comprising:
patterning the second magnetic layer in a chamber by changing a gas in the chamber, after patterning the third magnetic layer in the chamber.

20. The method of claim 11, further comprising:
patterning the third magnetic layer in a first chamber;
transferring the magnetoresistive element from the first chamber to a second chamber in a state of being non-oxidized the magnetoresistive element; and
patterning the second magnetic layer in the second chamber.

* * * * *